United States Patent [19]
Mossman

[11] 3,982,150
[45] Sept. 21, 1976

[54] BISTABLE STORAGE TUBE HAVING STORAGE DIELECTRIC OF PHOSPHOR PARTICLES COATED WITH SECONDARY EMISSIVE MATERIAL

[75] Inventor: Ralph A. Mossman, Portland, Oreg.

[73] Assignee: Tektronix, Inc., Beaverton, Oreg.

[22] Filed: Apr. 8, 1974

[21] Appl. No.: 458,947

Related U.S. Application Data

[60] Division of Ser. No. 37,378, May 7, 1960, Pat. No. 3,862,450, which is a continuation of Ser. No. 618,129, Feb. 23, 1967, abandoned.

[52] U.S. Cl. ............................... 313/398; 427/64; 427/67; 427/157; 427/158
[51] Int. Cl.² ..................... H01J 29/39; H01J 29/10
[58] Field of Search ................ 313/107, 92 R, 400, 313/68, 396, 398; 117/33.5 C, 33.5 L; 252/2; 427/64, 67, 157, 158

[56] References Cited
UNITED STATES PATENTS

| | | | |
|---|---|---|---|
| 2,169,046 | 8/1939 | Headrick | 313/400 |
| 2,817,599 | 12/1957 | Edwards et al. | 117/100 B |
| 3,293,473 | 12/1966 | Anderson | 313/9 L |
| 3,293,474 | 12/1966 | Gibson | 313/68 |
| 3,312,850 | 4/1967 | McMillan et al. | 252/2 |
| 3,664,862 | 5/1972 | Kingsley et al. | 117/33.5 C |
| 3,862,450 | 1/1975 | Mossman | 313/398 X |

*Primary Examiner*—Michael R. Lusignan
*Attorney, Agent, or Firm*—Adrian J. LaRue

[57] ABSTRACT

The present invention relates generally to charge image storage tubes having a direct viewing storage target including a storage dielectric of phosphor material capable of bistable storage of a charge image and which emits a light image corresponding to such charge image, and in particular to an improved storage dielectric of phosphor particles coated with smaller particles of a high secondary electron emissive material bonded to such phosphor particles and to a method of manufacture thereof. A small amount of secondary emissive material is employed efficiently to increase the writing speed and useful lifetime of the storage dielectric without greatly decreasing the brightness of the light image emitted by the phosphor. In one embodiment using 3.5 per cent of magnesium oxide secondary emissive material with 96.5 per cent of manganese activated zinc orthosilicate phosphor material, a writing speed of 400,000 centimeters per second and a light image brightness of 3.5 foot-lamberts was obtained. The method of manufacture of the improved storage dielectric includes coating the phosphor particles with a secondary emissive forming substance, and then heating the coated phosphor particles to produce the secondary emissive material and to simultaneously bond such secondary emissive material to the phosphor particles.

5 Claims, 5 Drawing Figures

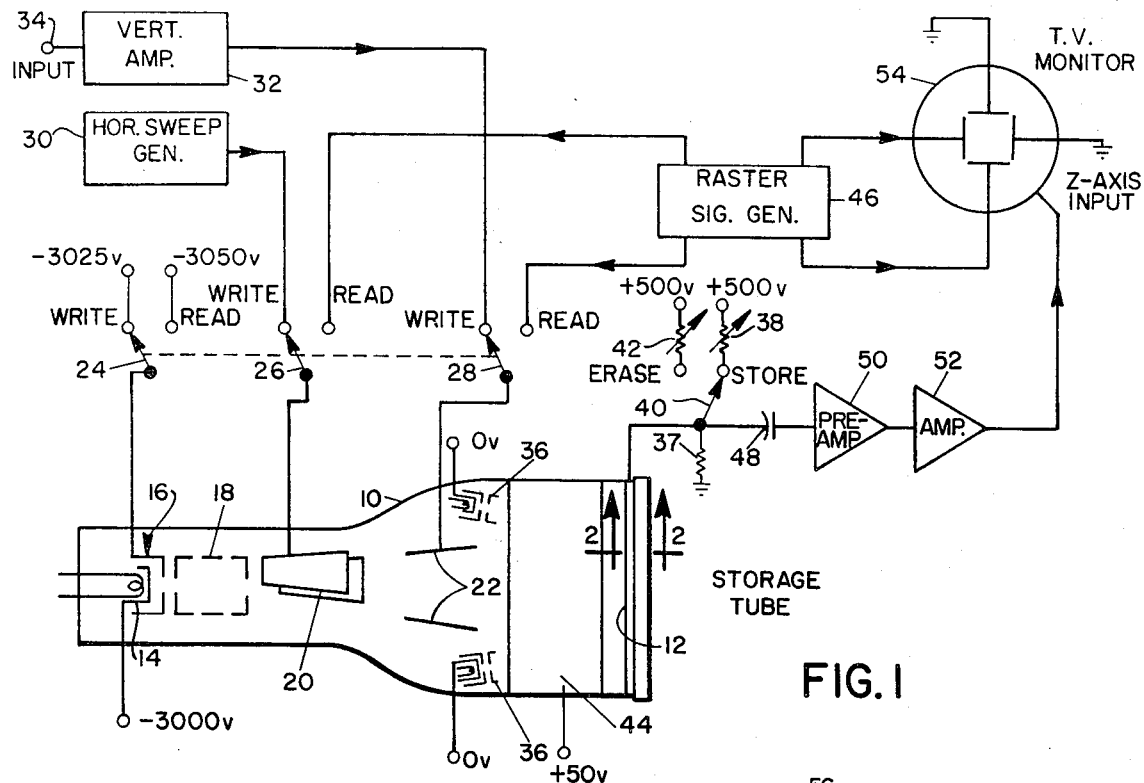
FIG. 1
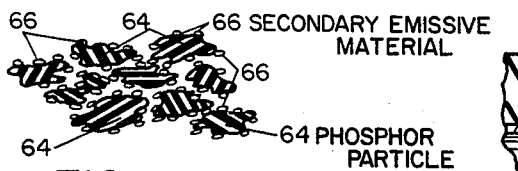
FIG. 5
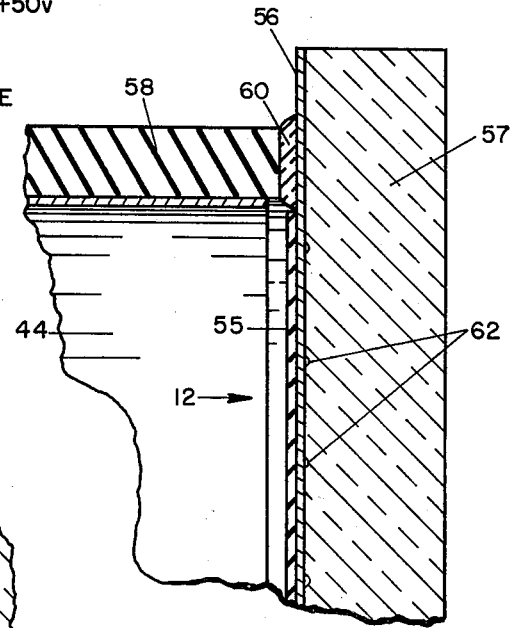
FIG. 2
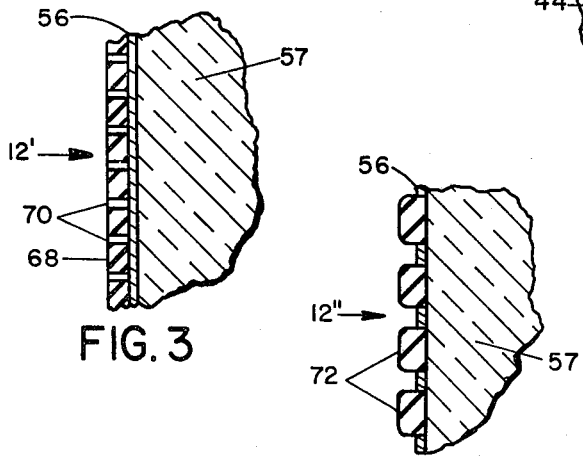
FIG. 3
FIG. 4

BISTABLE STORAGE TUBE HAVING STORAGE DIELECTRIC OF PHOSPHOR PARTICLES COATED WITH SECONDARY EMISSIVE MATERIAL

This is a division of application Ser. No. 37,378, filed May 7, 1960, now U.S. Pat. No. 3,862,450, patented Jan. 21, 1975, which is a continuation of Ser. No. 618,129, filed Feb. 23, 1967, now abandoned.

BACKGROUND OF THE INVENTION

The improved storage dielectric of the present invention is especially useful in direct viewing bistable storage tubes which are employed in storage type cathode ray oscilloscopes, but may also be used in radar, and sonar apparatus as well as in other display devices such as those employed as part of data transmission systems. Previous bistable storage tubes employing phosphor storage dielectrics have had a slow "writing speed" which is the maximum velocity of deflection of a writing beam which will still produce a stored charge image, due to the relatively low secondary electron emission of the phosphor material. In order to increase this writing speed it has previously been proposed to add higher secondary emissive material, such as magnesium oxide, to the phosphor storage dielectric by loosely mixing the particles of magnesium oxide with particles of phosphor material. While this does increase writing speed, unfortunately it also has the disadvantage of greatly reducing the brightness of the light image emitted by the phosphor material due to the large amount of magnesium oxide required. As a result previous bistable storage tubes employing phosphor storage dielectrics either have a high brightness of about 6 foot-lamberts but relatively slow writing speed of approximately 25,000 centimeters per second obtained by omitting any secondary emissive additive, or have a relatively low brightness of about 2 foot-lamberts and a high writing speed of 100,000 centimeters per second by using such secondary emissive additive. Thus previously it was thought that both high brightness and fast writing speed were not possible when using a storage dielectric of phosphor material.

While the so-called transmission type or grid control storage tubes having a mesh storage target with a non-phosphor storage dielectric and a separate phosphor viewing screen are capable of fast writing rate and high brightness, these are much more complicated, expensive and delicate tube structures than the simplified storage tube of the present invention in which the storage dielectric is itself the phosphor material which emits a light image, so that such phosphor storage dielectric may be provided as a layer on the glass face plate of the tube envelope.

The improved storage dielectric of the present invention solves the above-mentioned problem by providing the high secondary emissive material as a coating of smaller particles on the surface of the phosphor particles so that such secondary emissive material is used most efficiently thereby greatly reducing the amount of secondary emissive additive needed to increase the writing speed to the desired speed. By using a lesser amount of high secondary emissive material, the storage dielectric of the present invention produces a light image of higher brightness due in part to the greater percentage of phosphor material, and in part to less attenuation of such light image by the secondary emissive material. In addition, by positioning the secondary emissive material only over a portion of the surface of each phosphor particle it enables the low velocity flood electrons to strike both the phosphor particle and its secondary emissive coating simultaneously which makes more efficient use of the phosphor material since the secondary emissive material does not prevent the electrons from striking the phosphor. It should be noted that the low velocity flood electrons are only accelerated through a potential difference of approximately 200 to 500 volts, so that they will not penetrate through a layer of secondary emissive material to the phosphor particle in the event that such phosphor particle is completely masked from the electrons by the high secondary emissive material which occurs in the prior storage dielectric employing a mixture of phosphor material and secondary emissive material.

The method of manufacture of the storage dielectric of the present invention forms the high secondary emissive material from a substance coated on the phosphor particles, so that the secondary emissive is intimately bonded to the phosphor particles as it is formed. However, in the previous storage dielectrics the secondary emissive material is formed separately before it is mixed with the phosphor particles, and such secondary emissive material is not bonded to the phosphor particles.

The phosphor storage dielectric of the present invention can be made porous to enable the collection of secondary electrons through such storage dielectric and the addition of secondary emissive material does not interfere with such collection because it is bonded to the phosphor particles and does not fill the pores between adjacent phosphor particles, unlike previous storage dielectrics in which it is merely mixed with such phosphor. In addition, it has been found that the storage dielectric of the present invention has a longer useful lifetime than previous phosphor storage dielectrics.

It is therefore one object of the present invention to provide an improved bistable storage apparatus which is capable of fast writing speed in producing the stored charge image and emits a light image of high brightness corresponding to the stored charge image.

Another object of the present invention is to provide an improved storage tube of simple and economical construction in which a storage dielectric of phosphor particles and high secondary emissive material coated on such phosphor particles is employed.

Still another object of the present invention is to provide an improved storage dielectric of long, useful lifetime which is capable of bistable storage of a charge image produced thereon at a fast writing speed and which emits a light image of high brightness corresponding to the stored charge image by employing phosphor particles coated with high secondary emissive material bonded to such phosphor particles.

A further object of the present invention is to provide an improved method of manufacture of a phosphor storage dielectric capable of bistable charge image storage which is simple and reliable, in which a high secondary emissive material is formed from a substance previously coated on the phosphor particles so that the secondary emissive material formed is simultaneously bonded to the phosphor particles.

An additional object of the present invention is to provide an improved storage dielectric of phosphor particles coated by smaller particles of high secondary emissive material bonded to the phosphor particles to enable a small amount of secondary emissive material to be used efficiently to increase the writing speed of the storage dielectric without greatly decreasing the brightness of the light image emitted by the phosphor particles and, at the same time, providing a longer useful lifetime for the storage dielectric.

BRIEF DESCRIPTION OF DRAWINGS

Additional objects and advantages of the present invention will be apparent from the following detailed description of certain preferred embodiments thereof and from the attached drawings of which:

FIG. 1 is a schematic diagram of a charge image storage apparatus including a simplified storage tube employing the storage dielectric of the present invention;

FIG. 2 is an enlarged horizontal section view taken along the line 2—2 of FIG. 1 showing a portion of one embodiment of a storage target employing the storage dielectric of the present invention;

FIG. 3 is an enlarged section view of a portion of another embodiment of a storage target employing the storage dielectric of the present invention;

FIG. 4 is an enlarged section view of a portion of a third embodiment of a storage target employing the storage dielectric of the present invention; and FIG. 5 is a greatly enlarged section view of a portion of the storage dielectric of the present invention which may be employed in either of the storage targets of FIGS. 2, 3 or 4.

DETAIL DESCRIPTION OF INVENTION

As shown in FIG. 1, a charge image storage apparatus in accordance with the present invention includes a simplified direct viewing bistable storage tube 10 of the type shown in U.S. Pat. No. 3,293,473 of R. H. Anderson, issued Dec. 20, 1966. A phosphor storage target 12 is mounted within the evacuated envelope of the storage tube and positioned so as to be bombarded by high velocity writing electrons emitted from a writing gun cathode 14, which may be connected to a D.C. potential of −3000 volts. The writing gun also includes a control grid 16 as well as accelerating and focusing anodes 18 to form a narrow beam of high velocity writing electrons. The beam of writing electrons is transmitted through horizontal deflection plates 20 and vertical deflection plates 22 which deflect the electron beam in a conventional manner to cause such beam to produce a charge image on the phosphor storage dielectric of storage target 12.

The writing gun may also be employed as the reading gun to scan the storage dielectric to produce an electrical readout signal on the target electrode of the storage target 12 corresponding to the stored charge image in a manner hereafter described, by moving the switches 24, 26 and 28 from the "write" position shown to the "read" position. In the "write" position switch 24 connects control grid 16 to a D.C. supply voltage of −3025 volts and in the "read" position of such switch to a supply voltage of −3050 volts to slightly reduce the current density of the reading beam, which prevents erasure of the stored charge image during readout. In the "write" position of switch 26 the horizontal deflection plates 20 are connected to a horizontal sweep generator 30 which applies a sawtooth or ramp voltage thereto, while in the "write" position of switch 28 the vertical deflection plates 22 are connected to the output of a vertical amplifier 32 whose input terminal 34 is connected to the source of the input signal whose waveform is sought to be stored on the storage target 12. The vertical amplifier 32 and the horizontal sweep generator 30, as well as the storage tube 10 all form parts of a cathode ray oscilloscope which operates in a conventional manner and will not be described further.

Once a charge image is written on the storage target 12 by the high velocity writing electrons, it can be stored as a bistable charge image in a conventional manner by bombarding the storage dielectric uniformly with low velocity flood electrons emitted from the two flood guns 36. During storage the voltage applied to the backing plate or target electrode of the storage target 12 by a voltage divider including a fixed resistor 37 connected in series with a variable resistor 38 by a switch 40, is approximately +200 volts with respect to the flood gun cathode voltage, such target voltage being within the "stable range" of voltages over which the storage dielectric is capable of bistable storage of a charge image formed thereon.

In order to erase the charge image the switch 40 is moved from the "store" position to the "erase" position to connect a variable resistor 42 in series with resistor 37 so that a higher voltage above the "fade positive" voltage is applied to the target electrode to cause the potential of the storage dielectric to increase until it is substantially uniform all over such storage dielectric and equals the potential of the target electrode. Then the target voltage is decreased below the "retention threshold" voltage and subsequently raised slowly above the retention threshold voltage into the stable range to enable bistable storage of another charge image. While this variation in target voltage for erasure may be done manually by variable resistor 42, in actual practice it is done by pulsing the target electrode. In order to assure uniform bombardment of the storage dielectric of the storage target 12 by the low velocity flood electrons, a plurality of collimating electrodes may be provided as coatings on the inner wall of the storage tube envelope, one of such collimating electrodes 44 being shown in FIG. 1 as connected to a D.C. supply voltage of 450 volts between the voltages of the flood gun cathode and the target electrode.

In order to provide an electrical readout signal a raster signal generator 46 is connected to the horizontal deflection plates 20 and to the vertical deflection plates 22 of the storage tube through switches 26 and 28, respectively, in their "read" position. These raster signals may be sawtooth voltages similar to those employed in a conventional television receiver so that the vertical signal has a frequency of 60 cycles a second and the horizontal signal has a frequency of about 15,000 cycles per second. This causes the electron beam emitted by the cathode 14 to be uniformly scanned in a rectangular raster pattern across the surface of the storage target to produce an electrical readout signal on the target electrode which is transmitted through an A.C. coupling capacitor 48, a preamplifier 50 and a power amplifier 52 to the Z-axis or brightness modulation input of a television monitor tube 54. The horizontal and vertical deflection plates of the television monitor tube 54 may be driven by the raster signal generator 46 at the same frequency or related frequency to that of the corresponding raster signals supplied to the storage tube, in order to cause a reproduction of the storage charge image to be produced on the television monitor tube due to the brightness modulation of the electron beam in such monitor tube by the electrical readout signal of the storage tube.

As shown in FIG. 2, one embodiment of the storage tube of the present invention includes a storage target 12 having a storage dielectric 55 of phosphor material and high secondary emissive material applied as an integral or undivided layer of particles over a thin, light transparent conductive film 56 of tin oxide forming the target electrode of the storage target, which is coated on the inner surface of a glass face plate 57 forming part of the envelope of the storage tube. The target electrode film 56 extends through a seal provided between the face plate 57 and a funnel portion 58 of the storage tube envelope in order to enable electrical connection to such target electrode from an external voltage source. When the funnel portion 58 of the envelope is made of ceramic material it is sealed to the glass face plate 57 by a fused glass frit 60, which apparently penetrates through the thin, conductive film 56. While it is not essential, graticule lines 62 in the form of prescribed notches or fused glass frit deposits, may be provided on the inner surface of the glass face plate beneath the conductive film 56, such graticule lines being illuminated by edge lighting the face plate 57 with light bulbs (not shown) outside the envelope.

The storage dielectric layer 55 is sufficiently thin and porous to enable secondary electrons omitted from the surface of the layer bombarded by the writing beam and the flood electrons, to be transmitted through such dielectric layer by way of the pores between adjacent phosphor particles, and collected by the target electrode 56. The operation of this storage target is described in greater detail with respect to a similar storage target shown in U.S. Pat. No. 3,293,473 mentioned previously. However, the storage dielectric employed in the storage target 12, a portion of which is shown in FIG. 5, differs from that of the above-mentioned patent in that phosphor particles 64 are coated with smaller particles 66 of high secondary electron emissive material which are bonded to such phosphor particles. While different storage phosphors and secondary emissive materials may be employed in the preferred embodiment of the present invention P-1 phosphor, which is zinc orthosilicate with a manganese activator and has a chemical designation $Zn_{4n2}SiO_4:Mn$, has been used for the phosphor particles 64 and magnesium oxide (MgO) used for the secondary emissive particles 66. While the exact nature of the bond between the secondary emissive particles 66 and the phosphor particles 64 is not clearly understood, it is possible that the manganese reacts with the oxygen of the P-1 phosphor to produce a chemical bond. However it is also possible that the secondary emissive particles are surface bonded to the phosphor particles by sintering or other non-chemical bonding. In any event it is clear that the secondary emissive particles 66 are tightly bonded to the phosphor particles 64, as opposed to being loosely mixed with such phosphor particles in the manner of prior phosphor storage dielectrics. As a result fewer secondary emissive particles 66 are used in the present storage dielectric but produce an even faster writing rate without greatly decreasing the brightness of the light image emitted by the phosphor particles due to the fact that there is a greater percentage of phosphor and such secondary emissive particles do not prevent the flood electrons from striking such phosphor particles. In addition, since the particles of secondary emissive material are bonded to the phosphor particles they do not pack in the pores or spaces between adjacent phosphor particles, which tends to interfere with efficient collection of secondary electrons through the storage dielectric by the target electrode 56, as is thought to be the case of the earlier storage dielectrics.

The storage dielectric shown in FIG. 5 can be employed in other storage target structures, including the two additional embodiments shown in FIGS. 3 and 4. The storage target 12' of FIG. 3 is similar to that of FIG. 2 except that a storage dielectric layer 68 of much greater thickness is possible by providing a plurality of spaced apertures or holes 70 through such storage dielectric to enable secondary electrons to be collected by the target electrode 56 through such holes. Thus, while the integral storage dielectric layer 55 of FIG. 2 must be sufficiently thin to enable the pores between the phosphor particles to transmit the secondary electrons through such layer, this is not necessary with the target of FIG. 3 because artificial holes 70 have been provided. Holes 70 provide substantially straight passageways through the storage dielectric 68 so that even though such storage dielectric is of too great a thickness to enable secondary electrons to be transmitted through the pores between adjacent phosphor particles, such secondary electrons can be collected by target electrode 56 through holes 70. As in the case of FIG. 2, the storage dielectric 68 of the target 12' of FIG. 3 is in the form of phosphor particles coated with particles of secondary emissive material bonded thereto, as shown in FIG. 5.

FIG. 4 shows a third embodiment of the storage target 12'' which is similar to that of FIG. 2 except that the storage dielectric is divided into a plurality of separate spaced portions or dots 72 and the target electrode film 56 is provided with a plurality of apertures spaced uniformly over the surface of the storage target with the storage dielectric dots 72 positioned within such apertures in contact with the glass face plate 57. The storage dielectric dots 72, however, are made of the same storage dielectric of phosphor particles 64 coated by smaller particles 66 of secondary emissive material, in the manner shown in FIG. 5. A storage tube employing this type of dot pattern storage dielectric is described in U.S. Pat. No. 3,293,474 of C. B. Gibson, issued Dec. 20, 1966.

In addition to P-1 phosphor, the phosphor particles 64 of the storage dielectric of the present invention can be made of other storage phosphors including P-3 phosphor which is zinc beryllium silicate with a manganese activator designated as $ZnBeSiO_4:Mn$, P-5 phosphor which is calcium tungstate with a tungstate activator designated as $CaWO_4:W$. Also such storage phosphor may be P-13 phosphor which is magnesium silicate with a manganese activator, P16 which is calcium magnesium silicate with an activator of cesium and lithium, P-25 phosphor which is calcium silicate with a manganese activator, and P-27 phosphor which is zinc phosphate with a manganese activator.

Furthermore, secondary electron emissive materials other than magnesium oxide may be employed, such as aluminum oxide ($Al_2O_3$) or beryllium oxide (BeO) or combinations of these secondary emissives. Of course the secondary emissive materials must have a higher secondary electron emission efficiency than the phosphor with which it is employed. Also it should be noted that both the phosphor and secondary emissive must be of high resistivity or a good insulator in order to enable bistable storage.

When a storage target made in accordance with FIG. 2 was provided with a storage dielectric including P-1 phosphor particles coated with a magnesium oxide secondary emissive of 3.5 per cent, a writing speed of approximately 400,000 centimeters per second was obtained with a flood gun current of 60 microamperes, and the light image produced had a brightness of approximately 3.5 foot-lamberts.

The storage dielectric of FIG. 5 may be made by a method of manufacture which includes the steps of coating phosphor particles with a secondary emissive forming substance and heating the coated phosphor particles to form the secondary emissive material and simultaneously bond such secondary emissive material to the surface of the phosphor particles. In one specific example 96.5 grams of P-1 phosphor is added to a solution formed by 18.6 grams of magnesium acetate designated as $Mg(C_2H_3O_2)_2 \cdot 4H_2O$ dissolved in 400 milliliters of distilled water, to form a slurry. The phosphor slurry is then heated to remove all of the water and stirred to prevent the phosphor particles from precipitating out of the slurry, so that a dry particulate material is obtained which includes particles of P-1 phosphor material coated by magnesium acetate. This coated particulate material is then fired at a temperature of 700°C in air for about 1 hour to cause to form small particles 66 of magnesium oxide secondary emissive material and to simultaneously bond such secondary emissive material to the surface of the P-1 phosphor particles 64. This provides a storage dielectric which has a chemical composition of 96.5 per cent P-1 phosphor and 3.5 per cent magnesium oxide. The above method can also be carried out with any suitable magnesium salt which is soluble in water, wuch as magnesium nitrate designated as $Mg(NO_3)_2$, in place of the magnesium acetate.

It should be noted that an "active" magnesium oxide having a high secondary emission efficiency is apparently formed only at temperatures below 900°C. However, higher temperatures may be employed with the other secondary emissive materials. In this regard, when aluminum oxide is employed as the secondary emissive, aluminum acetate designated as $Al(C_2H_3O_2)_3$, or a water soluble aluminum salt such as aluminum nitrate designated as $Al(NO_3)_3 \cdot 9H_2O$, may be employed as the material coated on the phosphor particles to form the secondary emissive material. Similarly when beryllium oxide is the secondary emissive material to be formed, a water soluble beryllium salt such as beryllium carbonate designated as $(BeO)_5 \cdot CO_2 \cdot 5H_2O$ may be employed.

The storage dielectric may be applied to the face plate of the storage tube in any conventional manner such as by water settling, spraying, photographic masking in the case of FIG. 4, or by employing a decalcomania of a temporary binder of plastic or other organic material mixed with the storge dielectric. The decal is formed as a thin, self-supporting sheet of substantially uniform thickness and such organic binder material is removed during the heating and outgassing process of the evacuation step in the manufacture of the storage tube.

Another method of forming the phosphor storage dielectric of the present invention which is similar to that described above involves forming a slurry of P-1 phosphor and magnesium nitrate dissolved in water in accordance with the previously described method. To this slurry is added ammonium carbonate designated as $(NH_4)_2CO_3$, in sufficient amount to cause magnesium carbonate ($MgCO_3$) to precipitate onto the surface of the P-1 phosphor particles. The solution is then filtered to remove the coated phosphor particles which are dried to remove any water to provide a particulate material of P-1 phosphor particles coated with magnesium carbonate. The coated phosphor particles are then fired in air at 700°C for 1 hour to cause the formation of magnesium oxide and to bond such magnesium oxide to the surface of the P-1 phosphor particles. Alternatively ammonium hydroxide ($NH_4OH$) can be substituted for the ammonium carbonate in the above method so that magnesium hydroxide or $Mg(OH)_2$, precipitates onto the phosphor particles and forms the secondary emissive coating, of MgO.

The methods of manufacture of the present invention insure a uniform concentration of the secondary emissive material throughout the storage dielectric and are capable of reproducing storage dielectrics of similar writing rate and brightness characteristics on the face plate of the storage tubes. As a result of this reliable reproduction the percentage of tubes manufactured which meet the performance characteristic specifications greatly increases, and there are fewer defective storage tubes which must be discarded.

It will be obvious to those having ordinary skill in the art that many changes may be made in the above-described preferred embodiments of the present invention. For example, other types of storage targets in storage tubes may be made which employ the storage dielectric of the present invention in different target structures. Also it is possible that the coating of secondary emissive forming material may be formed on the phosphor particles by vapor deposition rather than by liquid evaporation. Therefore the scope of the present invention should only be determined by the following claims.

I claim:

1. A storage dielectric capable of bistable storage of a charge image formed thereon, comprising:
   a plurality of separate particles of phosphor material; and
   secondary emissive material coated on at least part of the surface of said phosphor particles with substantially all of the secondary emissive material in said storage dielectric being bonded to the phosphor particles only on the surface of said phosphor particles and substantially uniformly distributed throughout the storage dielectric, said secondary emissive material having a higher secondary electron emission efficiency than said phosphor material.

2. A storage dielectric in accordance with claim 1 in which the secondary emissive material is in the form of other particles smaller than the phosphor particles so that a plurality of secondary emissive particles are bonded to the outer surface of each phosphor particle.

3. A storage dielectric in accordance with claim 2 in which the particles of secondary emissive material are distributed substantially uniformly over the surface of the phosphor particle.

4. A storage dielectric in accordance with claim 1 in which the secondary emissive material is bonded to the phosphor particles by chemical bonds.

5. A storage dielectric in accordance with claim 2 in which the phosphor material includes manganese activated zinc orthosilicate and the secondary emissive material includes magnesium oxide.

* * * * *

UNITED STATES PATENT OFFICE
CERTIFICATE OF CORRECTION

PATENT NO. : 3,982,150
DATED : September 21, 1976
INVENTOR(S) : RALPH A. MOSSMAN It is certified that error appears in the above-identified patent and that said Letters Patent are hereby corrected as shown below:

Column 4, line 43 "450" should be --+50--

Column 5, line 45 "$Zn_{an2}SiO_4:Mn$" should be --$Zn_2SiO_4:Mn$--

Signed and Sealed this

Eighteenth Day of January 1977

[SEAL]

Attest:

RUTH C. MASON
*Attesting Officer*

C. MARSHALL DANN
*Commissioner of Patents and Trademarks*